(12) United States Patent
Kobayashi et al.

(10) Patent No.: US 10,407,542 B2
(45) Date of Patent: Sep. 10, 2019

(54) RESIST MATERIAL AND PATTERN FORMING METHOD USING SAME

(71) Applicant: Toshiba Memory Corporation, Tokyo (JP)

(72) Inventors: Kei Kobayashi, Yokohama (JP); Seiji Morita, Tokyo (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 16/143,681

(22) Filed: Sep. 27, 2018

(65) Prior Publication Data

US 2019/0023842 A1 Jan. 24, 2019

Related U.S. Application Data

(62) Division of application No. 15/478,317, filed on Apr. 4, 2017, now Pat. No. 10,113,030, which is a division of application No. 14/105,768, filed on Dec. 13, 2013, now abandoned.

(30) Foreign Application Priority Data

Jul. 26, 2013 (JP) ................. 2013-156007

(51) Int. Cl.
| | |
|---|---|
| *C08G 65/26* | (2006.01) |
| *C08F 20/02* | (2006.01) |
| *C08F 2/48* | (2006.01) |
| *C08F 216/14* | (2006.01) |
| *C08G 65/10* | (2006.01) |
| *C08G 65/18* | (2006.01) |
| *C08G 65/22* | (2006.01) |
| *C08L 71/02* | (2006.01) |
| *C08F 216/36* | (2006.01) |
| *C08G 59/02* | (2006.01) |

(Continued)

(52) U.S. Cl.
CPC ............ *C08G 65/2609* (2013.01); *C08F 2/48* (2013.01); *C08F 20/02* (2013.01); *C08F 216/1416* (2013.01); *C08F 216/36* (2013.01); *C08G 59/02* (2013.01); *C08G 65/105* (2013.01); *C08G 65/18* (2013.01); *C08G 65/22* (2013.01); *C08L 71/02* (2013.01); *G03F 7/0002* (2013.01); *B29K 2101/10* (2013.01)

(58) Field of Classification Search
CPC .................................................. C08G 65/2609
See application file for complete search history.

(56) References Cited

U.S. PATENT DOCUMENTS

| | | | |
|---|---|---|---|
| 8,168,109 B2 | 5/2012 | Houle et al. | |
| 2012/0027342 A1 | 2/2012 | Yoshida et al. | |
| 2012/0231234 A1 | 9/2012 | Kodama | |

FOREIGN PATENT DOCUMENTS

| | | |
|---|---|---|
| JP | 2008-31324 A | 2/2008 |
| JP | 2009-209337 A | 9/2009 |
| WO | WO 2009/110536 A1 | 9/2009 |

*Primary Examiner* — Larry W Thrower
(74) *Attorney, Agent, or Firm* — Finnegan, Henderson, Farabow, Garrett & Dunner, L.L.P.

(57) ABSTRACT

In one embodiment, a resist material to be used in an imprint process includes a diluent monomer having a hydroxyl group and at least one functional group selected from a vinyl ether group, an epoxy group and an oxetanyl group. The material further includes a dendrimer having at least two reactive groups for photo-cationic polymerization. The material further includes a photo-acid generator as a polymerization initiator.

6 Claims, 3 Drawing Sheets

(51) Int. Cl.
*G03F 7/00* (2006.01)
*B29K 101/10* (2006.01)

RESIST MATERIAL AND PATTERN FORMING METHOD USING SAME

CROSS REFERENCE TO RELATED APPLICATION

This application is a division of U.S. application Ser. No. 15/478,317, filed Apr. 4, 2017, which is a divisional application of U.S. patent application Ser. No. 14/105,768, filed Dec. 13, 2013, which is based upon and claims the benefit of priority from the prior Japanese Patent Application No. 2013-156007, filed on Jul. 26, 2013, the entire contents of which are incorporated herein by reference.

FIELD

Embodiments described herein relate to a resist material and a pattern forming method using the same.

BACKGROUND

A method of performing an imprint process in the atmosphere of a condensable gas such as pentafluoropropane (PFP) is proposed to improve the yield of the imprint process. The condensable gas means a gas which is condensed and liquefied at a low pressure. When a template is pressed against a resist material under the condensable gas atmosphere, the condensable gas present between concave portions of patterns of the template and the resist material is compressed into a liquid. Therefore, bubbles of the condensable gas disappear from the concave portions, so that the concave portions are completely filled with the resist material.

DETAILED DESCRIPTION

Figure 1C:
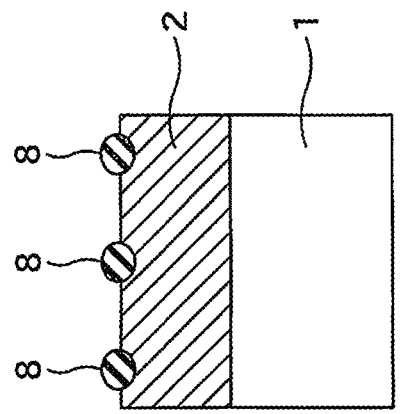
FIGS. 1A to 1F are diagrams for illustrating a pattern forming method of a first embodiment.

Embodiments will now be explained with reference to the accompanying drawings. It will be understood that these embodiments are not intended to limit the present invention. The drawings are schematic for the purpose of illustrating the present invention and facilitating the understanding thereof. In the drawings, the shape, size, ratio, or the like of some parts differ from those of actual products. The design of these features, however, can be changed or modified as needed taking into account the description below and techniques known in the art.

In one embodiment, a resist material to be used in an imprint process includes a diluent monomer having a hydroxyl group and at least one functional group selected from a vinyl ether group, an epoxy group and an oxetanyl group. The material further includes a dendrimer having at least two reactive groups for photo-cationic polymerization. The material further includes a photo-acid generator as a polymerization initiator.

First Embodiment (1) Pattern Forming Method

FIGS. 1A to 1F are cross-sectional views showing the respective steps of a pattern forming method of this embodiment. The pattern forming method using an imprint process in a condensable gas (such as PFP or trichlorofluoromethane) atmosphere will be described with reference to FIGS. 1A to 1F.

Figure 1B:
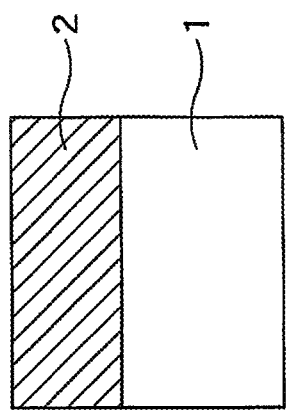
Figure 1A:
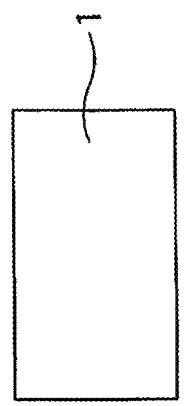

As shown in FIG. 1A, a substrate 1 is first prepared. Herein, a case where a semiconductor substrate is used as the substrate 1 will be described. An adhesion film material for an imprint process is applied onto the semiconductor substrate 1 by spinning and heated. As shown in FIG. 1B, this process forms an adhesion film 2 on the semiconductor substrate 1.

Next, as shown in FIG. 1C, drops of a resist material 8 of this embodiment are deposited (provided) on the adhesion film 2 by an inkjet method or the like. The resist material 8 has the property of being insoluble in a liquefied condensable gas (hereinafter, the liquefied condensable gas is referred to as the liquefied gas).

Figure 1F:
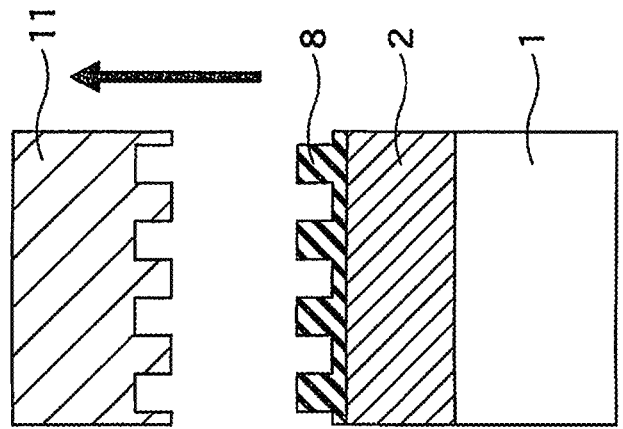
Figure 1E:
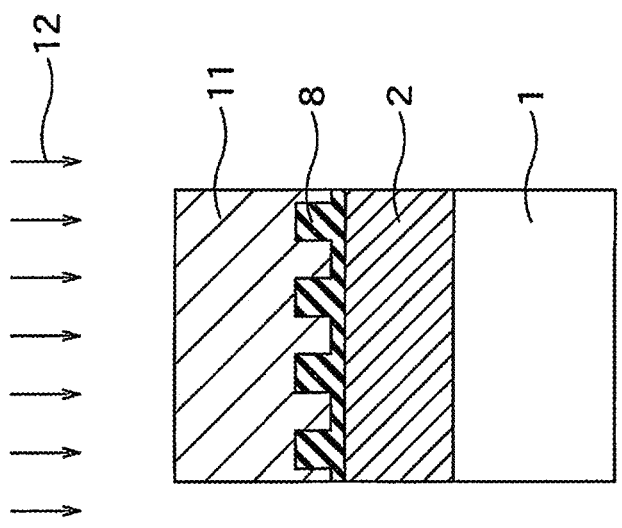
Figure 1D:
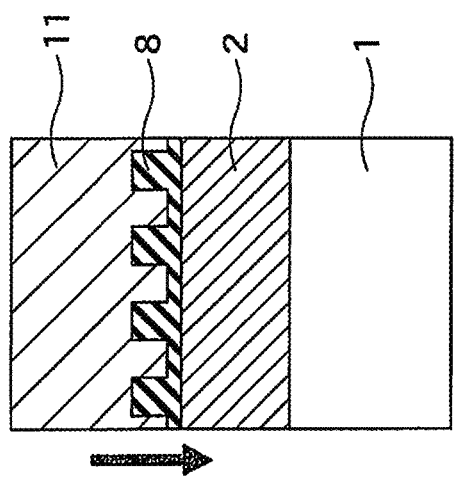

Next, as shown in FIG. 1D, the atmosphere is filled with a condensable gas, and a template 11 having concave-convex shape patterns is imprinted against the resist material 8. In this step, the condensable gas present between the concave portions of the patterns of the template 11 and the resist material 8 is compressed into a liquefied gas. Accordingly, bubbles of the condensable gas disappear from the concave portions, and the concave portions are completely filled with the resist material 8. The resist material 8, which has the property of being insoluble in the liquefied gas, is not dissolved in the liquefied gas in this step.

Next, as shown in FIG. 1E, ultraviolet rays 12 are applied to the resist material 8 while the template 11 is imprinted against the resist material 8, so that the resist material 8 is cured. In this step, the resist material 8 is not dissolved in the liquefied gas while cured. Therefore, the surface and the sidewall of patterns formed in the resist material 8 are prevented from being rough (irregular).

Finally, as shown in FIG. 1F, the template 11 is separated (released) from the cured resist material 8. In this way, the patterns of the templates 11 are transferred to the resist material 8, so that the patterns are formed in the resist material 8. For example, the adhesion film 2 and the semiconductor substrate 1 are then etched by using the patterns of the resist material 8 as a mask, so that a semiconductor device or the like are formed on the semiconductor substrate 1.

(2) Resist Material

The resist material 8 used in the pattern forming method will be described. The resist material 8 contains a crosslinking polyfunctional monomer having two or more reactive groups for photo-cationic polymerization, a diluent monomer for controlling the viscosity of the resist material 8, and a photo-acid generator as a polymerization initiator for polymerization reaction of these monomers. The crosslinking polyfunctional monomer includes a dendrimer having two or more reactive groups for photo-cationic polymerization, and the diluent monomer includes a monomer having a hydroxyl group and a reactive group for photo-cationic polymerization.

The resist material 8 contains 50% or more and 90% or less by weight of the diluent monomer, 5% or more and 50% or less by weight of the dendrimer (crosslinking polyfunctional monomer), and 0.3% or more and 10% or less by weight of the photo-acid generator, based on the total weight of the resist material 8. An optimum value can be selected as the content of each component in the resist material 8, depending on the imprint conditions or the like.

Hereinafter, the diluent monomer, the dendrimer, and the photo-acid generator in the resist material 8 will be described.

(3) Diluent Monomer

The diluent monomer of this embodiment has a hydroxyl group and is hydrophilic. In other words, the diluent monomer has the property of being highly soluble in a polar solvent such as water and being insoluble in a nonpolar solvent. Since the liquefied gas (such as PFP or trichlorofluoromethane) functions as a nonpolar solvent, the diluent monomer having a hydroxyl group can have the property of being insoluble in the liquefied gas. The diluent monomer of this embodiment also has at least one of a vinyl ether group, an epoxy group, and an oxetanyl group as the reactive group for photo-cationic polymerization, together with the hydroxyl group.

The three types of reactive groups for photo-cationic polymerization have the characteristics described below, respectively. The vinyl ether group has a short time (polymerization initiation time) to initiate the cationic-polymerization reaction from exposure to light, and has a low polymerization reaction rate. In contrast, the epoxy group has a long polymerization initiation time and has a high reaction rate. The oxetanyl group has a polymerization initiation time near the middle between those of the vinyl ether and epoxy groups and has a low reaction rate. Since the polymerization initiation time and the reaction rate vary with the type of the reactive group for photo-cationic polymerization as shown above, a diluent monomer having a most suitable reactive group for photo-cationic polymerization should be selected depending on the imprint conditions or the like.

For example, a diluent monomer having a hydroxyl group and a vinyl ether group is represented by general formula Ia below. In general formula Ia, R is a hydrocarbon chain optionally having a cyclic hydrocarbon moiety, an aromatic ring, an ether bond, or the like.

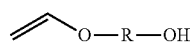

(Ia)

Examples of the diluent monomer having a hydroxyl group and a vinyl ether group include 2-hydroxyethyl vinyl ether, diethylene glycol monovinyl ether, 4-hydroxybutyl vinyl ether, cyclohexanedimethanol monovinyl ether, ONB-DVE (manufactured by Daicel Corporation), and VEEA (manufactured by NIPPON SHOKUBAI CO., LTD.) or the like.

For example, the diluent monomer having a hydroxyl group and an epoxy group is represented by general formula Ib below. In general formula Ib, $R_1$ is a hydrocarbon chain optionally having a cyclic hydrocarbon moiety, an aromatic ring, an ether bond, or the like.

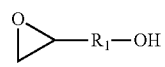

(Ib)

Examples of the diluent monomer having a hydroxyl group and an epoxy group include resorcinol diglycidyl ether and 3,4-epoxycyclohexenylmethyl-3',4'-epoxycyclohexenecarboxylate or the like.

For example, the diluent monomer having a hydroxyl group and an oxetanyl group is represented by general formula Ic below. In general formula Ic, $R_2$ and $R_3$ are each a hydrocarbon chain optionally having an oxetane ring, an ether bond, or the like.

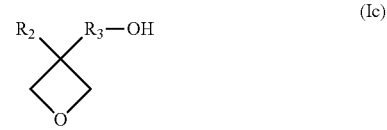

(Ic)

Examples of the diluent monomer having a hydroxyl group and an oxetanyl group include 3-methyl-3-oxetanemethanol, 3-ethyl-3-hydroxymethyloxetane, 2-ethylhexyloxetane, and 3-ethyl-3{[(3-ethyloxetane-3-yl)methoxy]methyl}oxetane or the like.

Another monomer having a hydroxyl group and a reactive group for photo-radical polymerization instead of the reactive group for photo-cationic polymerization could be a candidate for use as a diluent monomer in this embodiment. As a result of studies based on Globally Harmonized System of Classification and Labelling of Chemicals (GHS) data, however, the inventors have found that some monomers having a hydroxyl group and a reactive group for photo-radical polymerization fall under the category of chemicals with skin irritation (possessing the property of irritating human skin) or the like and have a safety problem. In contrast, it is found that the diluent monomer of this embodiment, specifically, the monomer having a hydroxyl group and a reactive group for photo-cationic polymerization does not fall under the category of chemicals with skin irritation, toxicity to reproduction (possessing the property of having an adverse effect on human reproduction), or the like and is safe. Therefore, the diluent monomer of this embodiment is safe for use in the imprint process.

(4) Dendrimer

Dendrimers are molecules with a globular structure, having a core (matrix) with a large volume and a number of branched polymer moieties extending radially around the core. Dendrimers, which have a globular structure, are more compact than linearly structured molecules with the same molecular weight. Therefore, dendrimers have low flow resistance, which means that they have low viscosity.

Dendrimers also have the property of being less shrinkable upon curing (less hardening-shrinkable) because there is only a small difference between their van der Waals distance (distance between non-bonded molecules) and bonding distance (distance between bonded molecules). In general, the distances between bonded organic material molecules (bonding distances) are shorter than their van der Waals distances (distance between non-bonded molecules).

This means that as organic material molecules are bonded together, the distance between the molecules decreases so that their volume decreases. The larger the number of intermolecular bonds per unit volume, the shorter the bonding distance, which means the smaller the organic material volume. In dendrimers, the core occupies most of the volume, and the polymer moieties occupy a relatively small volume. Therefore, a single dendrimer molecule has a relatively small number of polymer moieties per unit volume although the whole of it has a large number of polymer moieties. Also in dendrimers, the number of intermolecular bonds per unit volume is relatively small, because the intermolecular bonds are formed by coupling between polymer moieties. Therefore, dendrimers do not have significantly short bonding distances, and their volumetric shrinkage is low.

Examples of the dendrimer of this embodiment include dendrimers having two or more groups of one type selected from vinyl ether, epoxy, and oxetanyl as reactive groups for photo-cationic polymerization.

As a result of studies based on GHS data, the inventors found that none of these dendrimers fall under the category of chemicals with skin irritation, toxicity to reproduction, or the like. Therefore, the dendrimer of this embodiment can be deemed to be safe.

(5) Photo-Acid Generator

The resist material 8 contains a photo-acid generator (cation generator) as a polymerization initiator. Examples of the photo-acid generator include diphenyl-4-methylphenyl-sulfonium trifluoromethanesulfonate and diphenyl[4-(phenylsulfanyl)phenyl]sulfonium hexafluoro-λ5-stibanuide or the like.

In this embodiment, the resist material 8, which contains the diluent monomer insoluble in the liquefied gas, has the property of being insoluble in the liquefied gas. According to this embodiment, therefore, the resist material 8 is prevented from being dissolved in the liquefied gas when the template 11 is imprinted against the resist material 8 under the condensable gas atmosphere. Therefore, when cured, the resist material 8 remains not dissolved in the liquefied gas, so that the surface and the sidewall of the patterns of the resist material 8 are prevented from becoming rough (irregular).

According to this embodiment, the resist material 8, which contains the dendrimer with low viscosity, also has the property of being less viscous. Therefore, the resist material 8 can be quickly charged into the concave portions of the patterns of the template 11. This means that the imprint process can be performed at a high rate.

According to this embodiment, the resist material 8, which contains the dendrimer less shrinkable upon curing, also has the property of being less shrinkable upon curing. Therefore, the patterns of the resist material 8 of this embodiment are less deformable upon curing.

In addition, the resist material 8 of this embodiment, which is composed of safe materials, is safe for use in the imprint process.

Second Embodiment

This embodiment differs from the first embodiment in that the resist material used can be cured not only by photo-cationic polymerization reaction but also by photo-radical polymerization reaction.

(1) Resist Material

The resist material of this embodiment is cured by photo-cationic polymerization reaction and photo-radical polymerization reaction. This resist material contains a dendrimer having two or more reactive groups for photo-radical polymerization, a diluent monomer having a hydroxyl group and a vinyl ether group as a reactive group for photo-cationic polymerization, and an acid-and-radical generator capable of functioning as a photo-cationic polymerization initiator and a photo-radical polymerization initiator.

The rate of photo-radical polymerization reaction is higher than that of photo-cationic polymerization reaction. When the resist material of this embodiment is used, both photo-cationic polymerization reaction and photo-radical polymerization reaction can be used, so that the high rate of photo-radical polymerization reaction can compensate for the low rate of photo-cationic polymerization reaction. According to this embodiment, therefore, the resist material can have a higher reaction rate and can be quickly cured.

Hereinafter, the diluent monomer, the dendrimer, and the photo-acid generator contained in the resist material of this embodiment will be described.

(2) Diluent Monomer

The diluent monomer of this embodiment also has a hydroxyl group as in the first embodiment. Therefore, the diluent monomer of this embodiment has the property of being insoluble in the liquefied gas. The diluent monomer also has a vinyl ether group as a reactive group for photo-cationic polymerization, together with the hydroxyl group. The vinyl ether group is generally a functional group to undergo photo-cationic polymerization reaction. However, the vinyl ether group can also function as a reactive group for photo-radical polymerization. Therefore, this diluent monomer can undergo two types of polymerization reactions and can increase the reaction rate.

Examples of the diluent monomer having the hydroxyl group and the vinyl ether group may be the same as those in the first embodiment.

(3) Dendrimer

The dendrimer of this embodiment differs from that of the first embodiment by having a reactive group for photo-radical polymerization. As mentioned above, the rate of photo-radical polymerization reaction is higher than that of photo-cationic polymerization reaction. In the resist material of this embodiment, therefore, the high rate of photo-radical polymerization reaction of the dendrimer can compensate for the low rate of photo-cationic polymerization reaction of the diluent monomer. As described in the first embodiment, the dendrimer also has low viscosity and the property of less shrinkable upon curing.

The dendrimer of this embodiment has an acryloyl group as the reactive group for photo-radical polymerization. Examples of the dendrimer of this embodiment include Viscoat 1000 (manufactured by Osaka Organic Chemical Industry Ltd.) and STAR-501 (manufactured by Osaka Organic Chemical Industry Ltd.) or the like.

As a result of studies based on GHS data, the inventors have found that none of these dendrimers fall under the category of chemicals with skin irritation, toxicity to reproduction, or the like. Therefore, the dendrimer of this embodiment can be deemed to be safe.

(4) Acid-and-Radical Generator

The resist material of this embodiment contains an acid-and-radical generator so that it can be cured by photo-cationic polymerization reaction and photo-radical polymerization reaction. Such a polymerization initiator may be an onium salt. Examples of such an onium salt include diphenyl(4-methylphenyl)sulfonium and tris(4-methylphenyl)sulfonium or the like.

In this embodiment, the resist material can be cured by photo-cationic polymerization reaction and photo-radical polymerization reaction, because it contains the diluent monomer having the reactive group for photo-cationic polymerization, the dendrimer having the reactive group for photo-radical polymerization, and an onium salt capable of functioning as a photo-cationic polymerization initiator and a photo-radical polymerization initiator. In the resist material of this embodiment, therefore, the high rate of photo-radical polymerization reaction can compensate for the low rate of photo-cationic polymerization reaction. Therefore, the resist material of this embodiment can undergo a higher rate of reaction and be more quickly cured than that of the first embodiment. This means that the imprint process can be performed at a higher rate.

The resist material of this embodiment contains a diluent monomer insoluble in the liquefied gas and a dendrimer having low viscosity and being less shrinkable upon curing as that of the first embodiment does. Therefore, this embodiment can produce the same advantageous effect as the first embodiment.

In addition, the resist material of this embodiment is composed of safe materials as that of the first embodiment is. Therefore, the resist material of this embodiment is safe for use in the imprint process.

[Evaluation of Resist Materials]

The inventors have evaluated the properties of resist materials of the respective embodiments (the viscosity, the curing time of the resist material, the curing shrinkage ratio, and the surface roughness of the patterns). Specifically, three types of resist materials of the first and second embodiments were prepared as samples A, B, and C. Table 1 shows the details of the composition of the resist materials as samples A, B, and C. Another resist material containing a diluent monomer having an acryloyl group (a reactive group for photo-radical polymerization), a dendrimer having an acryloyl group, and a photo-radical generator as a polymerization initiator was also prepared as a comparative example (sample D) (see Table 1).

Each prepared resist material was measured for viscosity at room temperature (25° C.) before curing (see Table 2 and Table 3). Next, an imprint process was performed using each resist material, in which patterns of the resist material were formed. More specifically, an adhesion film for an imprint process was formed on a substrate, and drops of the resist material of each sample were deposited on the adhesion film by an inkjet method. Subsequently, a template was imprinted against the resist material under a PEP atmosphere. The resist material was cured by being irradiated with ultraviolet light while the template was imprinted against the resist material. In this process, the ultraviolet light intensity was 20 mJ/cm$^2$. Finally, the template was separated from the cured resist material, so that the patterns of the resist material were formed.

In the imprint process, the time from the application of ultraviolet light to the resist material to the completion of the curing of the resist material (the curing time) was measured as an index of reaction rate. The shorter curing time means the higher reaction rate. The curing shrinkage ratio of the resist material was also determined at room temperature (25° C.) (which was calculated from the measured volumes of the resist material before and after the curing) (see Table 2 and Table 3).

The surface roughness (arithmetic mean roughness Ra) of the patterns formed in each sample was measured using an atomic force microscope (AFM) (see Table 2 and Table 3). The surface roughness was measured for an area of 2.5 μm square.

Table 1 below shows the composition of the resist materials as samples A to D. Table 2 and Table 3 show the results of the measurement of samples A to D. Table 2 shows the results of the evaluation on a scale of 1, 2, 3, and 4 instead of showing the actual values. Table 3 shows how the results of the evaluation are rated on a scale of 1 to 4, in which a smaller number indicates a better result.

TABLE 1

|  | Diluent monomer | Dendrimer | Polymerization initiator |
|---|---|---|---|
| Sample A (First Embodiment) | Monomer with hydroxyl and vinyl ether groups | Dendrimer with oxetanyl group | Photo-acid generator |
| Sample B (First Embodiment) | Monomer with hydroxyl and oxetanyl groups | Dendrimer with epoxy group | Photo-acid generator |
| Sample C (Second Embodiment) | Monomer with hydroxyl and vinyl ether groups | Dendrimer with acryloyl group | Onium salt |
| Sample D (Comparative Example) | Monomer with acryloyl group | Dendrimer with acryloyl group | Photo-radical generator |

TABLE 2

|  | Viscosity before curing | Curing time | Curing shrinkage ratio | Surface roughness (Ra) of pattern obtained after curing |
|---|---|---|---|---|
| Sample A | 2 | 1 | 3 | 0.3 nm or less |
| Sample B | 2 | 1 | 3 | 0.3 nm or less |
| Sample C | 2 | 1 | 3 | 0.3 nm or less |
| Sample D | 3 | 1 | 3 | 4.5 nm or more |

TABLE 3

|  | 1 | 2 | 3 | 4 |
|---|---|---|---|---|
| Curing time | Less than 5 seconds | Equal to or more than 5 seconds and less than 10 seconds | Equal to or more than 10 seconds and less than 20 seconds | 20 seconds or more |
| Viscosity | Less than 3 cP | Equal to or more than 3 cP and less than 10 cP | Equal to or more than 10 cP and less than 20 cP | 20 cP or more |
| Curing shrinkage ratio | Less than 3% | Equal to or more than 3% and less than 5% | Equal to or more than 5% and less than 10% | 10% or more |

Figure 2A:
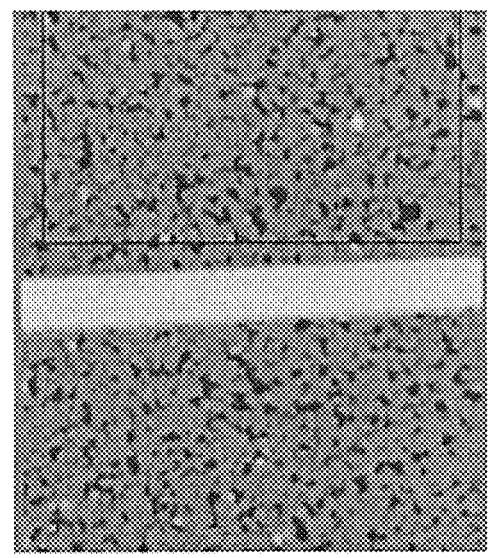
FIGS. 2A and 2B are photomicrographs of patterns formed in resist materials of the first embodiment, a second embodiment and a comparative example.
Figure 2B:
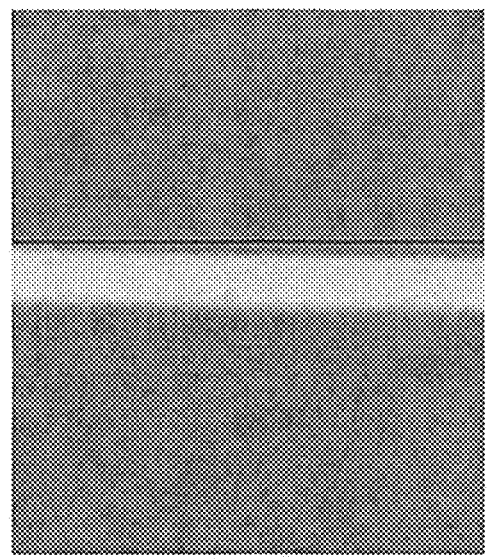

Table 2 shows that the patterns of the resist materials (samples A to D) of the embodiments have a surface roughness (Ra) of 0.3 nm or less, whereas sample D (comparative example) has a surface roughness of 4.5 nm or more. It is apparent that the surface of the patterns formed in the resist materials (samples A to C) of the embodiments is very flat as compared with that of the comparative example. This shows that according to the embodiments, the surface and sidewall of the patterns of the resist material can be prevented from becoming rough (irregular). FIGS. 2A and 2B are AFM photomicrographs showing the actual surfaces of samples A and D. FIG. 2A is an AFM photomicrograph of the surface of sample D, and FIG. 2B is an AFM photomicrograph of the surface of sample A. Both are at the same magnification. These photomicrographs also show that the surface of the patterns formed in sample A is flatter and less rough than that of sample D.

Table 2 also shows that the pre-curing viscosity, curing time (reaction rate), and curing shrinkage ratio of the resist materials of the embodiments (samples A to C) are at similar levels to those of the comparative example (sample D). This indicates that the viscosity, reaction rate, and curing shrinkage ratio of the resist materials of the embodiments reach the level required for resist materials to be used in imprint processes.

While certain embodiments have been described, these embodiments have been presented by way of example only, and are not intended to limit the scope of the inventions. Indeed, the novel materials and methods described herein may be embodied in a variety of other forms; furthermore, various omissions, substitutions and changes in the form of the materials and methods described herein may be made without departing from the spirit of the inventions. The accompanying claims and their equivalents are intended to cover such forms or modifications as would fall within the scope and spirit of the inventions.

The invention claimed is:

1. A resist material to be used in an imprint process, comprising:
   a diluent monomer having a hydroxyl group and at least one functional group selected from a vinyl ether group, an epoxy group and an oxetanyl group;
   a dendrimer with a globular structure having at least two reactive groups for photo-cationic polymerization; and
   a photo-acid generator as a polymerization initiator.

2. The material of claim 1, wherein the material comprises:
   50% or more and 90% or less by weight of the diluent monomer;
   5% or more and 50% or less by weight of the dendrimer; and
   0.3% or more and 10% or less by weight of the polymerization initiator.

3. The material of claim 1, wherein the dendrimer has a vinyl ether group, an epoxy group or an oxetanyl group as the reactive groups for photo-cationic polymerization.

4. The material of claim 1, wherein the diluent monomer having the hydroxyl group and the vinyl ether group is represented by general formula Ia:

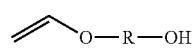
(Ia)

wherein R is a hydrocarbon chain.

5. The material of claim 1, wherein the diluent monomer having the hydroxyl group and the epoxy group is represented by general formula Ib:

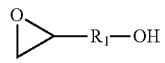
(Ib)

wherein $R_1$ is a hydrocarbon chain.

6. The material of claim 1, wherein the diluent monomer having the hydroxyl group and the oxetanyl group is represented by general formula Ic:

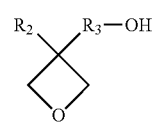
(Ic)

wherein each of $R_2$ and $R_3$ is a hydrocarbon chain.

* * * * *